(12) United States Patent
Xie et al.

(10) Patent No.: US 11,244,861 B2
(45) Date of Patent: Feb. 8, 2022

(54) METHOD AND STRUCTURE FOR FORMING FULLY-ALIGNED VIA

(71) Applicant: International Business Machines Corporation, Armonk, NY (US)

(72) Inventors: Ruilong Xie, Niskayuna, NY (US); Christopher J. Waskiewicz, Rexford, NY (US); Chih-Chao Yang, Glenmont, NY (US); Huai Huang, Saratoga, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/854,064

(22) Filed: Apr. 21, 2020

(65) Prior Publication Data
US 2021/0327756 A1    Oct. 21, 2021

(51) Int. Cl.
*H01L 21/768* (2006.01)
*H01L 23/522* (2006.01)

(52) U.S. Cl.
CPC .. *H01L 21/76897* (2013.01); *H01L 21/76805* (2013.01); *H01L 21/76835* (2013.01); *H01L 21/76837* (2013.01); *H01L 21/76877* (2013.01); *H01L 23/5223* (2013.01); *H01L 23/5226* (2013.01)

(58) Field of Classification Search
CPC .............. H01L 23/5226; H01L 23/522; H01L 23/5229
See application file for complete search history.

(56) References Cited

U.S. PATENT DOCUMENTS

| | | | |
|---|---|---|---|
| 8,299,625 B2 | 10/2012 | Ponoth et al. | |
| 8,992,792 B2 | 3/2015 | Chang et al. | |
| 9,324,650 B2 | 4/2016 | Edelstein et al. | |
| 9,685,406 B1 | 6/2017 | Briggs et al. | |
| 9,806,023 B1 | 10/2017 | Briggs et al. | |
| 9,966,337 B1 | 5/2018 | Briggs et al. | |
| 10,002,831 B2 | 6/2018 | Briggs et al. | |
| 10,177,028 B1 | 1/2019 | LiCausi et al. | |

(Continued)

OTHER PUBLICATIONS

B.D. Briggs et al., "Process Challenges in Fully Aligned Via Integration for Sub 32 nm Pitch BEOL," IEEE International Interconnect Technology Conference (IITC), Jun. 4-7, 2018, p. 148.

(Continued)

*Primary Examiner* — Thanhha S Pham
(74) *Attorney, Agent, or Firm* — L. Jeffrey Kelly; Ryan, Mason & Lewis, LLP

(57) ABSTRACT

A method for manufacturing a semiconductor device includes forming a first dielectric layer, and forming a second dielectric layer stacked on the first dielectric layer. In the method, a plurality of conductive lines are formed in the first and second dielectric layers, and the plurality of conductive lines are recessed to form a plurality of openings in the second dielectric layer. The method also includes forming a plurality of dielectric fill layers on the plurality of conductive lines in the plurality of openings. At least one of the plurality of dielectric fill layers is selectively removed with respect to the second dielectric layer to expose a conductive line of the plurality of conductive lines, and a via is formed in place of the selectively removed dielectric fill layer.

20 Claims, 10 Drawing Sheets

(56) References Cited

U.S. PATENT DOCUMENTS

| | | | |
|---|---|---|---|
| 2014/0342549 A1* | 11/2014 | Holmes | H01L 21/76883 |
| | | | 438/634 |
| 2016/0049364 A1* | 2/2016 | Edelstein | H01L 23/528 |
| | | | 257/774 |
| 2018/0315654 A1 | 11/2018 | Briggs et al. | |
| 2019/0019726 A1 | 1/2019 | Ryan et al. | |
| 2019/0021176 A1 | 1/2019 | Law et al. | |

OTHER PUBLICATIONS

B.D. Briggs et al., "Fully Aligned Via Integration for Extendibility of Interconnects to Beyond the 7 nm Node," IEEE International Electron Devices Meeting (IEDM), Dec. 2-6, 2017, 4 pages.

* cited by examiner

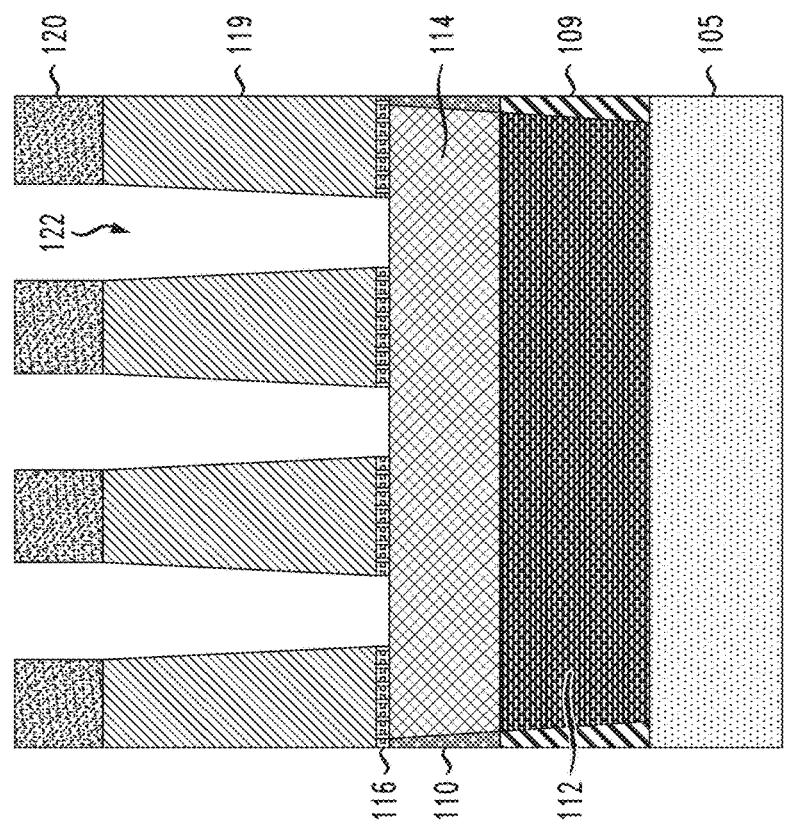
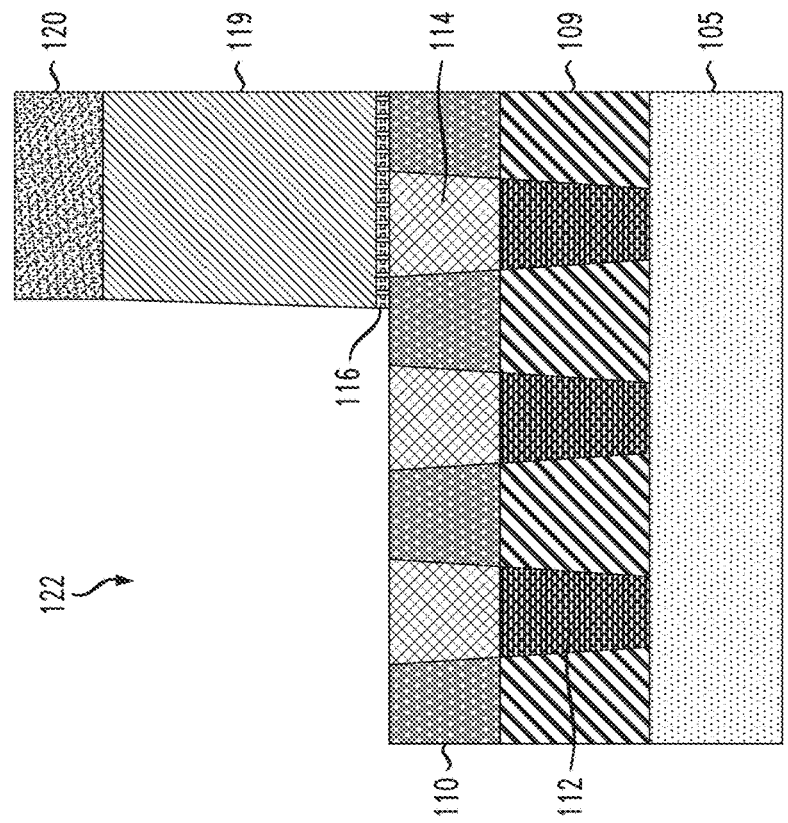

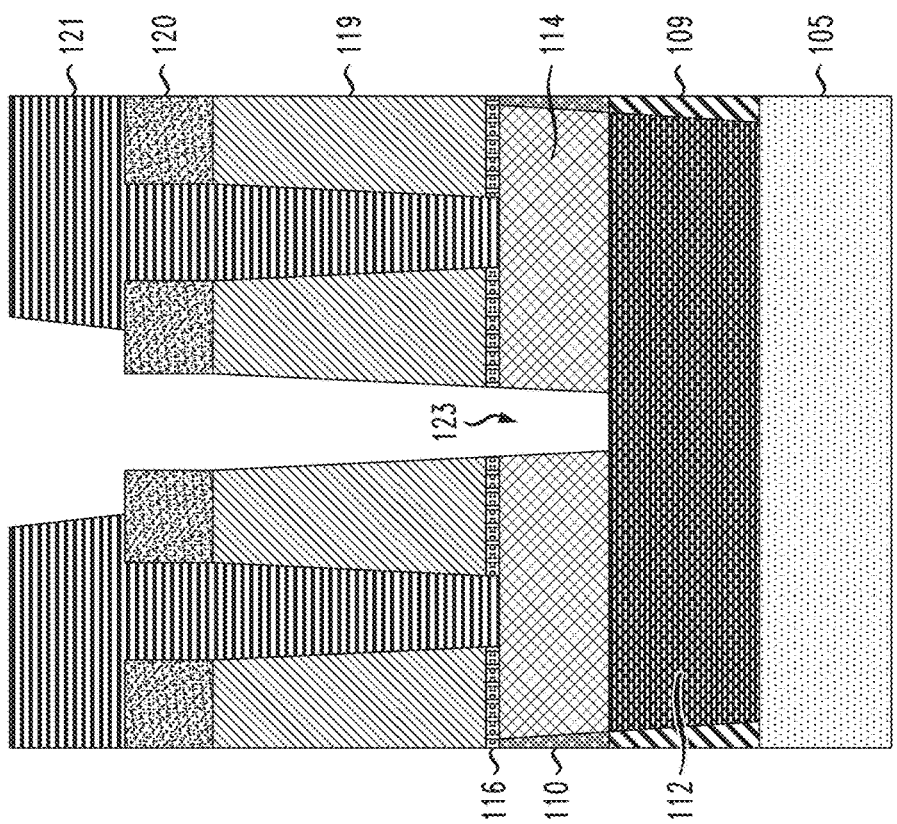
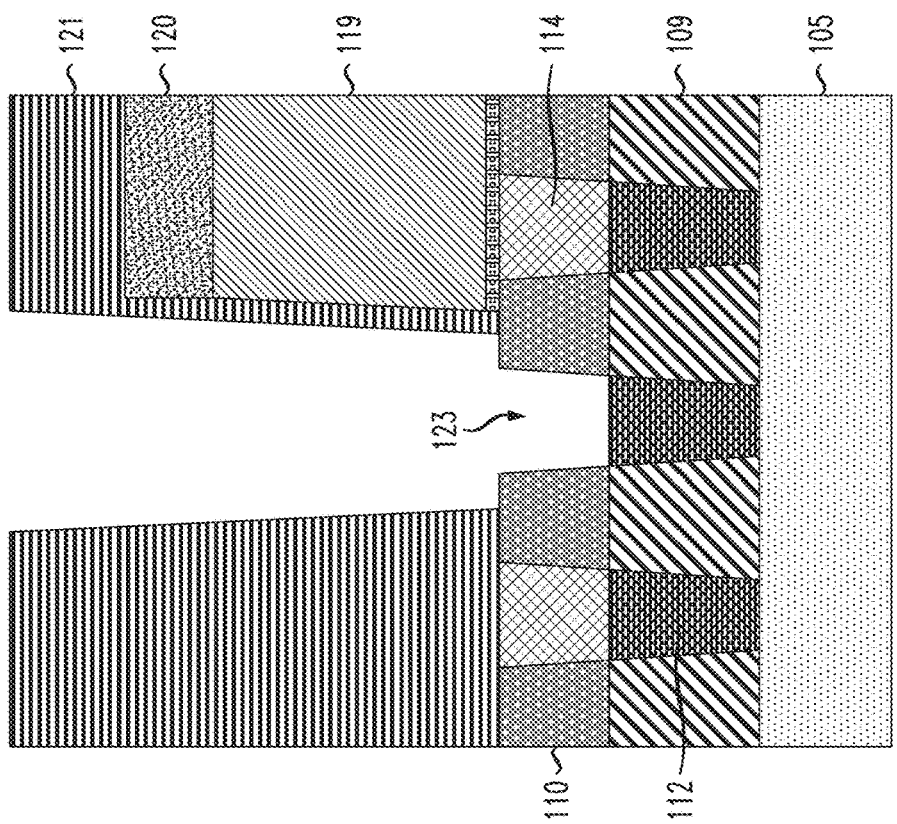

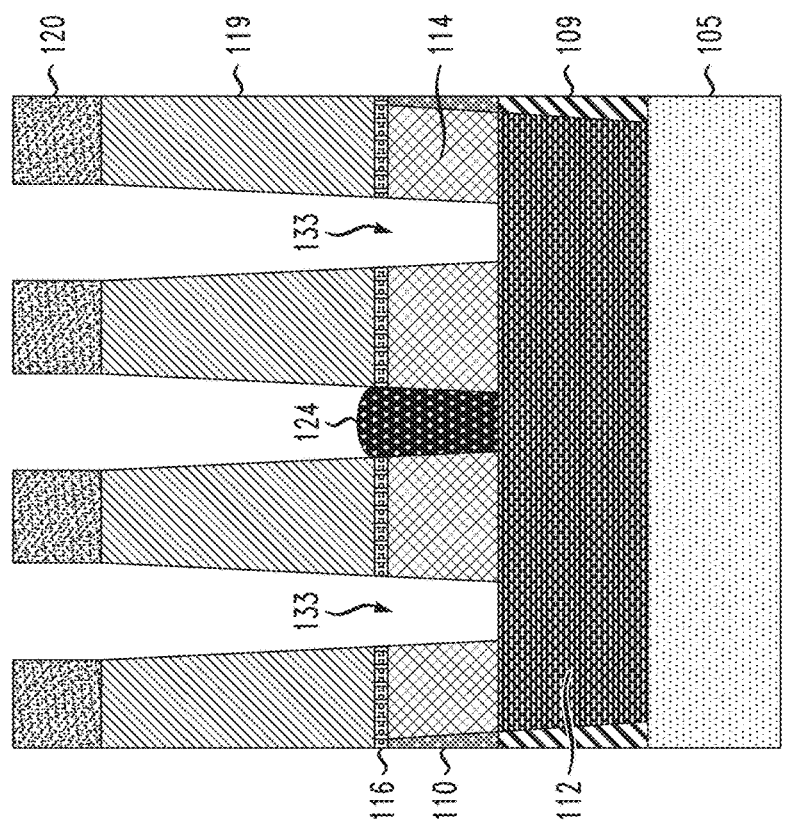
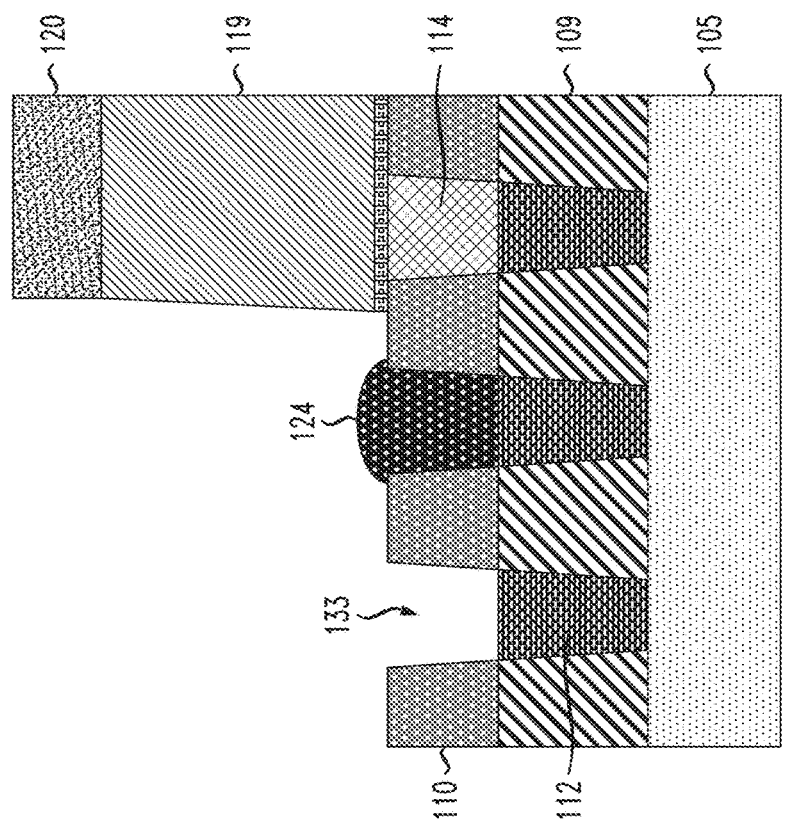

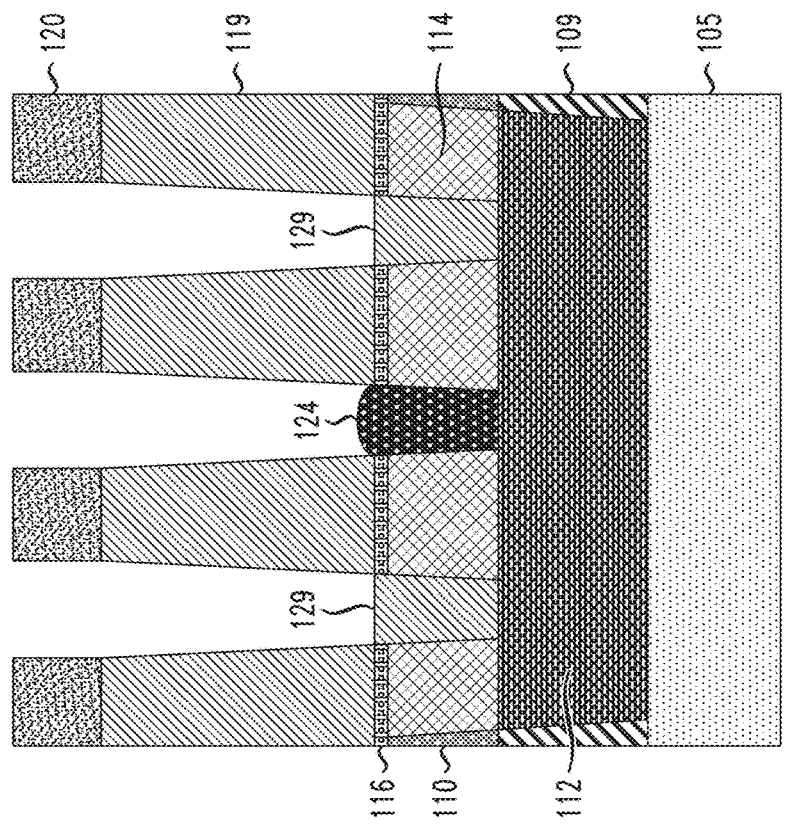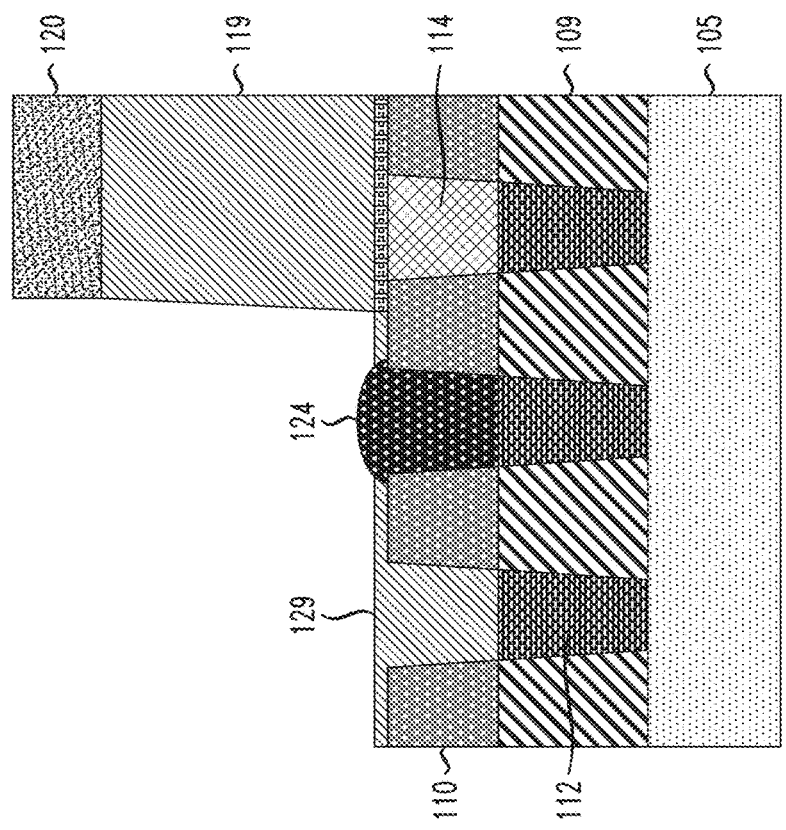

METHOD AND STRUCTURE FOR FORMING FULLY-ALIGNED VIA

BACKGROUND

Very-Large Scale Integrated (VLSI) circuits and Ultra-Large Scale Integrated (ULSI) circuits include interconnect structures having electrically conductive wires that connect devices in different levels of a semiconductor chip to each other. The conductive interconnects include metals, such as, for example, aluminum or copper, insulated by dielectric materials. Trends in the semiconductor industry have led to reduced gate length and chip size, resulting in smaller interconnect structures. As the interconnect structures decrease in size, overlay error between elements in the interconnect structure caused by misalignment during a lithography process, and the resulting reliability issues, have become areas of concern to semiconductor manufacturers.

Processing to form metal interconnects or vias that are fully aligned to a first metallization level (M1) and a second metallization level (M2) on the first metallization level has been attempted. The fully aligned metal interconnects are referred to herein as fully aligned vias (FAVs). In conventional FAV processing, due to poor etch selectivity to low-k dielectric layers, corners of openings in the low-k dielectric layers where vias are to be formed are subject to erosion during etching. Such erosion may result in interconnect issues, such as, for example, loss of self-alignment, which can lead to unwanted electrical connections such as shorts.

SUMMARY

According to an exemplary embodiment of the present invention, a method for manufacturing a semiconductor device includes forming a first dielectric layer, and forming a second dielectric layer stacked on the first dielectric layer. In the method, a plurality of conductive lines are formed in the first and second dielectric layers, and the plurality of conductive lines are recessed to form a plurality of openings in the second dielectric layer. The method also includes forming a plurality of dielectric fill layers on the plurality of conductive lines in the plurality of openings. At least one of the plurality of dielectric fill layers is selectively removed with respect to the second dielectric layer to expose a conductive line of the plurality of conductive lines, and a via is formed in place of the selectively removed dielectric fill layer.

According to an exemplary embodiment of the present invention, a semiconductor device includes a first dielectric layer. A plurality of lower conductive lines are disposed in the first dielectric layer and separated from each other by portions of the first dielectric layer. The semiconductor device also includes a second dielectric layer disposed on the first dielectric layer, and at least one via disposed in the second dielectric layer on a first conductive line of the plurality of lower conductive lines. At least one dielectric capping layer is disposed in the second dielectric layer on a second conductive line of the plurality of lower conductive lines, and a plurality of upper conductive lines are disposed on the at least one via and the at least one dielectric capping layer. The first dielectric layer and the dielectric capping layer each include a low-k dielectric material.

According to an exemplary embodiment of the present invention, a method for manufacturing a semiconductor device includes forming a first dielectric layer including a first dielectric material, and forming a second dielectric layer stacked on the first dielectric layer. The second dielectric layer includes a second dielectric material different from the first dielectric material. In the method, a plurality of conductive lines are formed in the first and second dielectric layers, and recessed to form a plurality of openings in the second dielectric layer. The method also includes forming a plurality of dielectric fill layers on the plurality of conductive lines in the plurality of openings. At least one of the plurality of dielectric fill layers is selectively removed with respect to the second dielectric layer to expose at least one conductive line of the plurality of conductive lines, and at least one via is formed in place of the selectively removed dielectric fill layer.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIG. 4A is a cross-sectional view taken along a first direction illustrating fabrication of a semiconductor device, and showing upper level metallization layer trench formation and etch stop layer removal, according to an exemplary embodiment of the present invention.

FIG. 4B is a cross-sectional view taken along a second direction perpendicular to the first direction illustrating fabrication of a semiconductor device, and showing upper level metallization layer trench formation and etch stop layer removal, according to an exemplary embodiment of the present invention.

FIG. 5A is a cross-sectional view taken along a first direction illustrating fabrication of a semiconductor device, and showing mask layer formation and patterning, and selective dielectric fill layer removal, according to an exemplary embodiment of the present invention.

FIG. 5B is a cross-sectional view taken along a second direction perpendicular to the first direction illustrating fabrication of a semiconductor device, and showing mask layer formation and patterning, and selective dielectric fill layer removal, according to an exemplary embodiment of the present invention.

FIG. 7A is a cross-sectional view taken along a first direction illustrating fabrication of a semiconductor device, and showing selective dielectric fill layer removal, according to an exemplary embodiment of the present invention.

FIG. 7B is a cross-sectional view taken along a second direction perpendicular to the first direction illustrating fabrication of a semiconductor device, and showing selective dielectric fill layer removal, according to an exemplary embodiment of the present invention.

FIG. 8A is a cross-sectional view taken along a first direction illustrating fabrication of a semiconductor device, and showing low-k dielectric layer formation in place of a removed dielectric fill layer, according to an exemplary embodiment of the present invention.

FIG. 8B is a cross-sectional view taken along a second direction perpendicular to the first direction illustrating fabrication of a semiconductor device, and showing low-k dielectric layer formation in place of removed dielectric fill layers, according to an exemplary embodiment of the present invention.

DETAILED DESCRIPTION

Figure 1B:
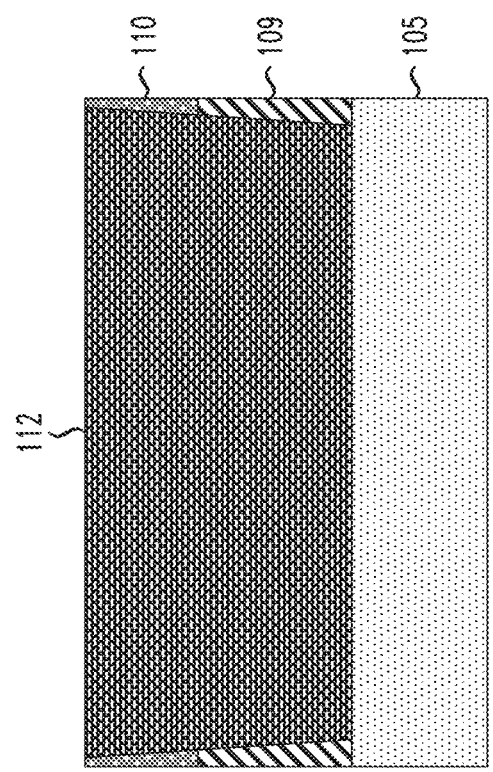
FIG. 1B is a cross-sectional view taken along a second direction perpendicular to the first direction illustrating fabrication of a semiconductor device, and showing formation of multiple dielectric layers and a metal line of a lower level metallization layer, according to an exemplary embodiment of the present invention.

Exemplary embodiments of the invention will now be discussed in further detail with regard to semiconductor devices and methods of manufacturing same and, in particular, to a formation of a FAV using multiple dielectric layers with different dielectric constants (k-values).

It is to be understood that the various layers and/or regions shown in the accompanying drawings are not drawn to scale, and that one or more layers and/or regions of a type commonly used in, for example, complementary metal-oxide semiconductor (CMOS), fin field-effect transistor (FinFET), metal-oxide-semiconductor field-effect transistor (MOSFET), programmable logic devices (PLDs), programmable gate arrays, programmable read-only memory (PROM) devices, including, but not limited to, erasable programmable read-only memories (EPROMS), electronically erasable programmable read-only memories (EEPROMS), and/or other semiconductor devices in which anti-fuses may be used, may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not necessarily be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, CMOSs, MOSFETs, FinFETs, PLDs, programmable gate arrays, PROMS, EPROMS, and/or EEPROMS. By way of non-limiting example, the semiconductor devices can include, but are not necessarily limited to CMOS, MOSFET, FinFET, PLD, programmable gate array, PROM, EPROM, and/or EEPROM devices, and/or semiconductor devices that use CMOS, MOSFET, FinFET, PLD, programmable gate array, PROM, EPROM, and/or EEPROM technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the figures. For example, as used herein, "vertical" refers to a direction perpendicular to the top surfaces of the dielectric or metal line layers in the cross-sectional views, and "horizontal" refers to a direction parallel to the top surfaces of the dielectric or metal line layers in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

There is a need for via and metallization layer structures and methods of manufacturing same which prevent corner erosion during formation of via and/or capping layer openings. In accordance with the embodiments, a dielectric fill material (e.g., SiN) having a high etch selectivity with respect to a dielectric layer (e.g., SiO$_2$) fills in spaces in the dielectric layer left after recessing of metal lines. The dielectric fill material (e.g., SiN) can be selectively removed with respect to the material of the dielectric layer (e.g., SiO$_2$) to form one or more via openings without corner erosion. Conductive via material is formed in the via opening(s) to form one or more vias. The dielectric fill material can also be selectively removed with respect to the material of the dielectric layer to form one or more openings (also without corner erosion), in which low-k dielectric capping material can be deposited to form one or more inter-metal dielectric layers. The dielectric fill material (e.g., SiN) has a relatively high dielectric constant (k) (e.g., greater than about 4.5 (k of SiN is ~7)), which is higher than the dielectric constant of the dielectric layer (e.g., SiO$_2$ (k~3.9)). The low-k dielectric capping material has a dielectric constant less than that of the dielectric fill material and less than that of the dielectric layer (e.g., less than ~3.9, such as, for example, less than about 3.0).

As used herein, "low-k" refers to dielectric materials having a relative dielectric constant less than about 3.0, and includes ultra-low-k dielectric materials.

Figure 1A:
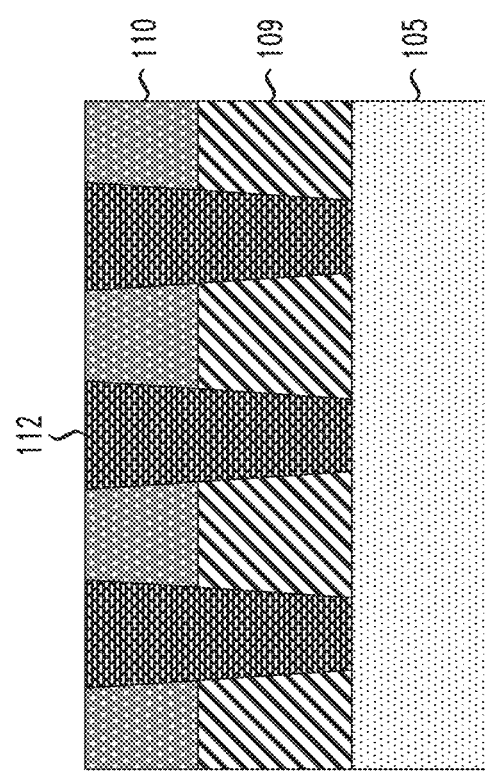
FIG. 1A is a cross-sectional view taken along a first direction illustrating fabrication of a semiconductor device, and showing formation of multiple dielectric layers and metal lines of a lower level metallization layer, according to an exemplary embodiment of the present invention.
Figure 9B:
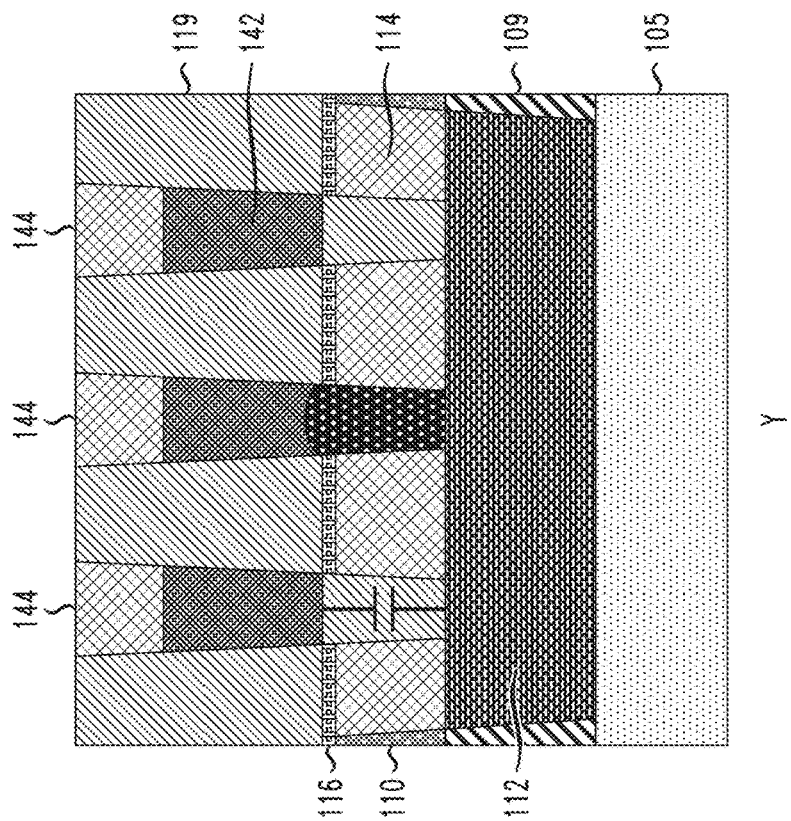
FIG. 9B is a cross-sectional view taken along a taken along a Y direction of FIG. 9C illustrating fabrication of a semiconductor device, and showing formation of metal lines and cap layers of an upper level metallization layer, according to an exemplary embodiment of the present invention.
Figure 9A:
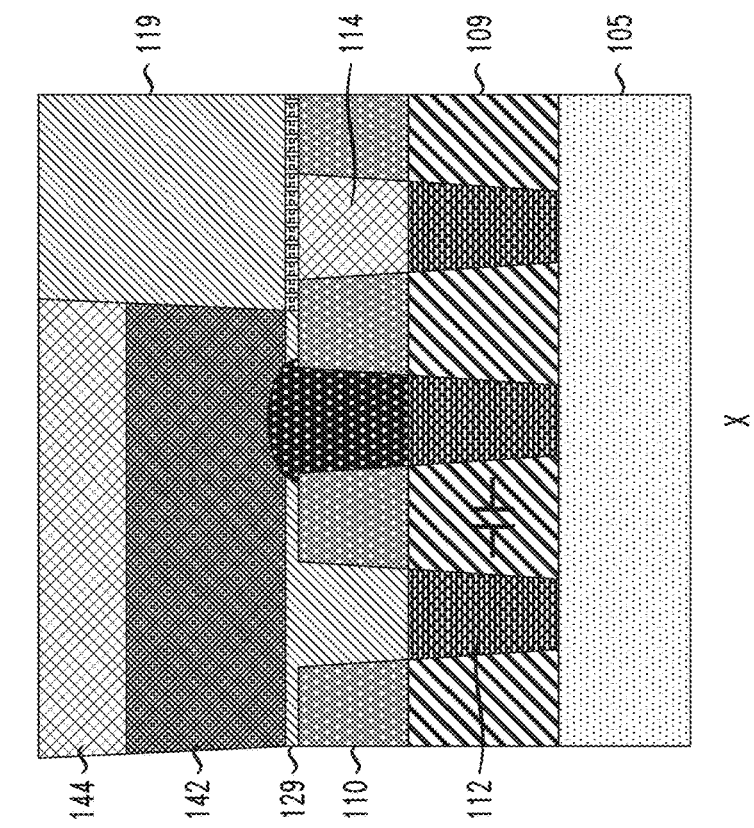
FIG. 9A is a cross-sectional view taken along an X direction of FIG. 9C illustrating fabrication of a semiconductor device, and showing formation of a metal line and cap layer of an upper level metallization layer, according to an exemplary embodiment of the present invention.

Referring to FIGS. 1A and 1B, a semiconductor device 100 includes a second dielectric layer 110 is stacked on a first dielectric layer 109, and a plurality of conductive lines 112 formed in the first and second dielectric layers 109 and 110. FIGS. 1A, 2A, 3A, 4A, 5A, 6A, 7A, 8A and 9A are cut across the conductive lines 112, and FIGS. 1B, 2B, 3B, 4B, 5B, 6B, 7B, 8B and 9B are cut along the conductive lines 112. FIG. 9A is also cut along the conductive lines 142, and FIG. 9B is also cut across the conductive lines 142.

According to an embodiment, the second dielectric layer 110 comprises, for example, silicon oxide (SiO$_2$) or some other dielectric such as, for example, SiN, SiCO or SiOCN. The material of the second dielectric layer 110 has a dielectric constant (k), for example, greater than about 3.0 (e.g., ~3.9), but less than that of a subsequently deposited dielectric fill layer 114 (see FIGS. 3A and 3B). The first dielectric layer 109 comprises, for example, a low-k dielectric such as, for example, fluorine-doped silicon dioxide, organosilicate glass (OSG), porous silicon dioxide, porous OSG, a spin-on organic polymeric dielectric, or a spin-on silicon based polymeric dielectric. The material of the first dielectric layer 109 has a dielectric constant (k), for example, less than about 3.0, which is less than the dielectric constant of the second dielectric layer 110.

The conductive lines 112 are formed in, for example, trenches or openings in the dielectric layers 109 and 110. The conductive lines 112 include an electrically conductive metal, such as, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides or combinations thereof. The conductive lines 112 can also include barrier layers (not shown) including, for example, titanium nitride, tantalum nitride or tungsten nitride conformally formed on sidewalls and bottom surfaces of trenches in the dielectric layers 109 and 110 and/or liner layers (not shown) including, for example, cobalt and/or ruthenium, which are conformally formed on the barrier layers. The conductive lines 112 and the first dielectric layer 109 form at least part of a lower metallization level ($M_{x-1}$).

The conductive lines 112 (and 142 in FIGS. 9A-9C), which may also be referred to as wires or metal lines, function as conductive contacts to form electrical connections between elements and/or devices, or form contacts to elements or devices. For example, as shown in FIGS. 1A and 1B, the conductive lines 112 are formed on a device layer 105. As can be understood by one of ordinary skill in the art, device layer 105 can be on a semiconductor substrate (not shown), with intervening layers (e.g., lower conductive lines, other devices, etc.) between the device layer 105 and the substrate. A semiconductor substrate may comprise semiconductor material including, but not limited to, Si, SiGe, SiC, SiGeC or other like semiconductor. In addition, multiple layers of the semiconductor materials can be used as the semiconductor material of the substrate. The device layer 105 includes a plurality of devices such as, for example, transistors, capacitors, and resistors, or metal lines or contacts at a lower level(s).

Figure 2B:
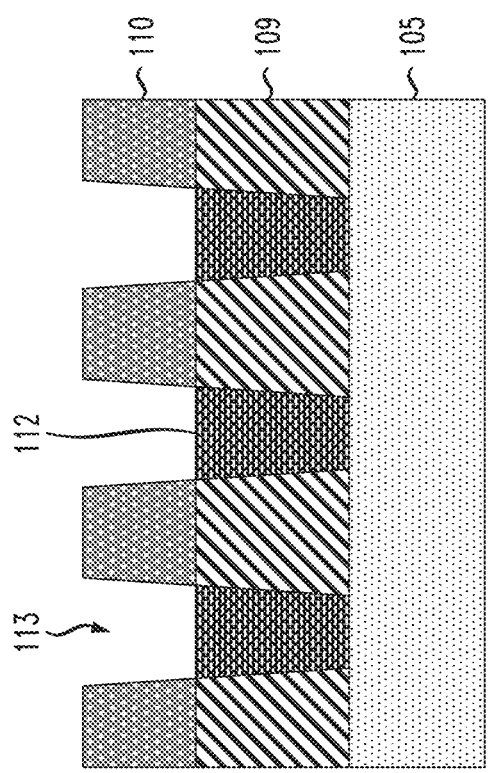
FIG. 2B is a cross-sectional view taken along a second direction perpendicular to the first direction illustrating fabrication of a semiconductor device, and showing recessing of a metal line of a lower level metallization layer, according to an exemplary embodiment of the present invention.
Figure 2A:
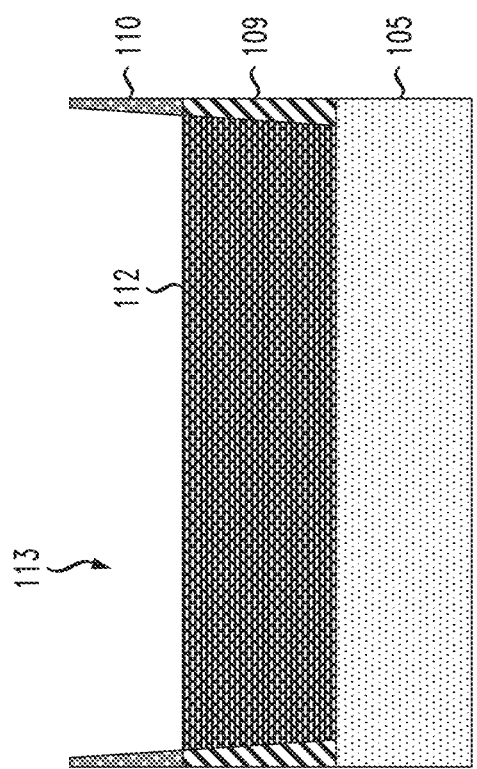
FIG. 2A is a cross-sectional view taken along a first direction illustrating fabrication of a semiconductor device, and showing recessing of metal lines of a lower level metallization layer, according to an exemplary embodiment of the present invention.

Referring to FIGS. 2A and 2B, the conductive lines 112 are recessed such that the top surfaces of the conductive lines 112 are recessed to a height that is below the top surface of the second dielectric layer 110 and level with or substantially level with the top surface of the first dielectric layer 109. The recessing forms vacant areas 113 (also referred to as openings) and is performed using, for example, a wet etch process to remove upper portions of the conductive lines 112.

Figure 3B:
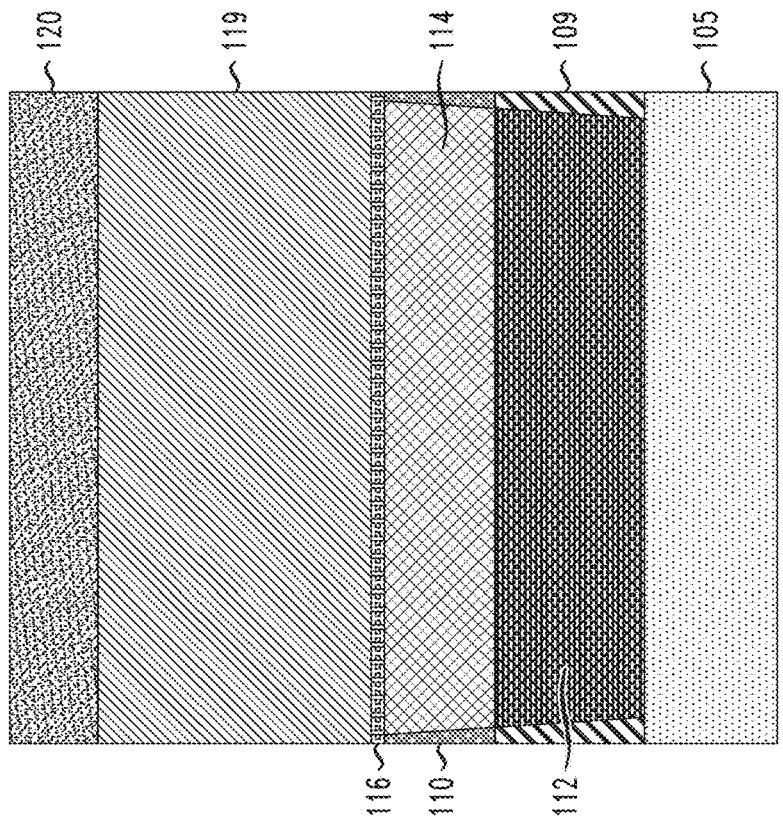
FIG. 3B is a cross-sectional view taken along a second direction perpendicular to the first direction illustrating fabrication of a semiconductor device, and showing formation of a dielectric fill, etch stop, inter-layer dielectric (ILD) and hardmask layers, according to an exemplary embodiment of the present invention.
Figure 3A:
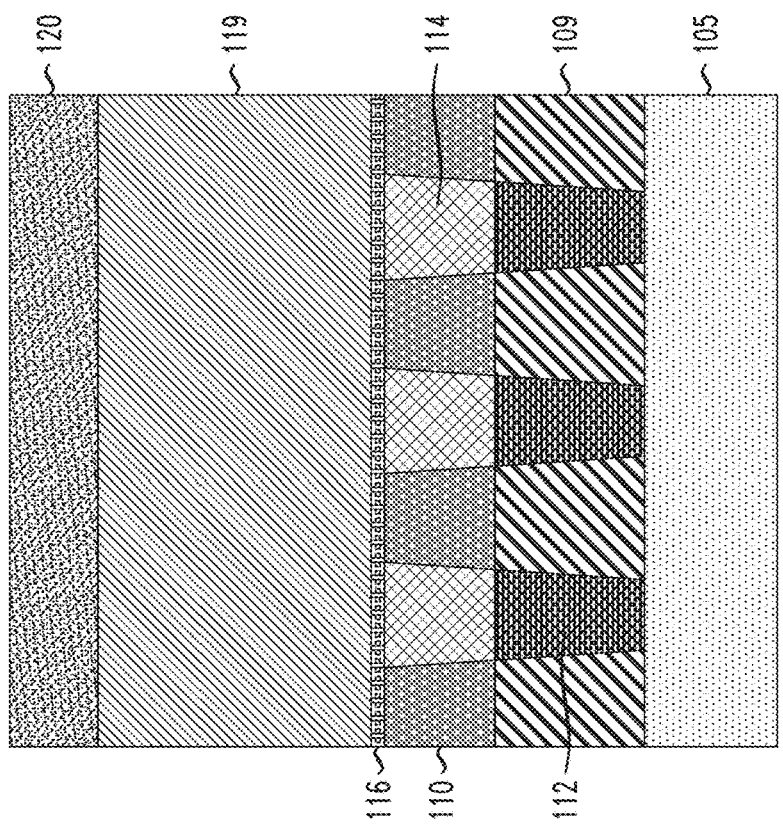
FIG. 3A is a cross-sectional view taken along a first direction illustrating fabrication of a semiconductor device, and showing formation of a dielectric fill, etch stop, inter-layer dielectric (ILD) and hardmask layers, according to an exemplary embodiment of the present invention.

Referring to FIGS. 3A and 3B, dielectric fill layers 114 comprising, for example, a nitride material (e.g., silicon nitride (SiN)), are formed in the vacant areas 113 adjacent portions of the second dielectric layer 110 and on the recessed conductive lines 112. The dielectric fill layers 114 comprise a material having a high etch selectivity with respect to the material of the second dielectric layer 110, to facilitate selective removal of the dielectric fill layers 114 with respect to the second dielectric layer 110. For example, the dielectric fill layers 114 can be SiN, which has a high etch selectivity with respect to SiO$_2$, a possible material for the second dielectric layer 110. According to an embodiment, the dielectric fill layers 114 comprise, but are not necessarily limited to, SiN, SiBCN, SiOCN, SiC or SiCO, and have a dielectric constant (k) higher than that of the second dielectric layers 110, such as, for example, greater than about 4.5.

The dielectric fill layers 114 are deposited using one or more deposition techniques, such as, but not necessarily limited to, physical vapor deposition (PVD), chemical vapor deposition (CVD), atomic layer deposition (ALD), plasma-enhanced CVD (PECVD), radio frequency CVD (RFCVD), molecular layer deposition (MLD), molecular beam deposition (MBD), liquid source misted chemical deposition (LSMCD) and/or sputtering, which can be followed by a planarization process, such as, for example, chemical mechanical planarization (CMP) to remove excess dielectric fill material from on top of the adjacent portions of the second dielectric layer 110, to result in top surfaces of the dielectric fill layers 114 being coplanar with top surfaces of the adjacent portions of the second dielectric layer 110. Alternatively, deposition of the dielectric fill layers 114 can be followed by an etch-back process to remove excess dielectric fill material from on top of the adjacent portions of the second dielectric layer 110, to result in top surfaces of the dielectric fill layers 114 being coplanar with top surfaces of the adjacent portions of the second dielectric layer 110.

An etch stop layer 116 is deposited on the second dielectric and dielectric fill layers 110 and 114. The etch stop layer 116 includes for example, aluminum nitride (AlN), aluminum oxide ($Al_yO_x$), SiC, or SiCO. The etch stop layer 116 is deposited using deposition techniques such as, but not necessarily limited to, PVD, CVD, ALD, PECVD, RFCVD, MLD, MBD, LSMCD, and/or sputtering. In some embodiments, the etch stop layer 116 is omitted.

An inter-layer dielectric (ILD) layer 119 is deposited on the etch stop layer 116. According to an embodiment, the ILD layer 119 comprises low-k dielectric material such as, for example, the same or similar materials as those described in connection with dielectric layer 109. The ILD layer 119 is deposited using, for example, PVD, CVD, ALD, PECVD, RFCVD, MLD, MBD, LSMCD, and/or sputtering. The etch stop layer 116 permits complete removal of the ILD layer 119 down to the etch stop layer 116. The ILD layer 119 forms part of an upper metallization level ($M_x$). A hardmask layer 120 is formed on the ILD layer 119. The hardmask layer 120 comprises, for example, silicon carbonitride (SiCN) SiN, $SiO_2$, or TiN.

Referring to FIGS. 4A and 4B, the hardmask layer 120 is patterned to remove portions thereof, and exposed portions of the ILD layer 119 (e.g., portions not covered by the remaining hardmask layer portions 120) are etched down to the etch stop layer 116, and then the exposed portions of the etch stop layer 116 are removed to form upper metallization level trenches 122 exposing portions of the dielectric fill and second dielectric layers 114 and 110.

A representative selectivity ratio of the etch rate of the ILD layer 119 with respect to that of the etch stop layer 116 would be approximately 5:1. According to an embodiment, the etching of the ILD layer 119 is performed using, for example, a fluorocarbon based dry etch process or an ultra-violet (UV) damage and wet etch process. The subsequent removal of the exposed portions of the etch stop layer 116 exposes portions of the dielectric fill layers 114, as well as portions of the second dielectric layer 110.

Referring to FIGS. 5A and 5B, a mask layer 121 comprising, for example, an organic planarization layer (OPL), is deposited in the upper metallization level trenches 122, and on top of the hardmask layer portions 120. By depositing an anti-reflective coating (ARC) layer and photo resist (not shown) on portions of the mask layer 121 followed by a lithography process, the mask layer 121 is patterned to remove exposed portions of the deposited mask layer 121. As shown in FIGS. 5A and 5B, the remaining portions of the mask layer 121 cover some of the second dielectric layers 110 and the dielectric fill layers 114, while other portions of the second dielectric layers 110 and of the dielectric fill layers 114 are left exposed where portions of the mask layer 121 were removed. As explained further herein, the portions of the dielectric fill layers 114 left exposed are selectively removed and replaced with vias.

The OPL includes, but is not necessarily limited to, an organic polymer including C, H, and N. In an embodiment, the OPL material can be free of silicon (Si). According to an embodiment, the OPL material can be free of Si and fluorine (F). As defined herein, a material is free of an atomic element when the level of the atomic element in the material is at or below a trace level detectable with analytic methods available in the art. Non-limiting examples of the OPL material include JSR HM8006, JSR HM8014, AZ UM10M2, Shin Etsu ODL 102, or other similar commercially available materials from such vendors as JSR, TOK, Sumitomo, Rohm & Haas, etc. The mask layer 121 comprising an OPL can be deposited, for example, by spin coating.

As can be understood from FIGS. 5A and 5B, after removal of the ARC layer, the exposed dielectric fill layers 114 not covered by the mask layer 121 are selectively removed with respect to the adjacent second dielectric layers 110 to form via openings exposing the underlying conductive lines 112, such as via opening 123 exposing an underlying one of the conductive lines 112. As noted herein, the etch selectivity of the dielectric fill layers 114 with respect to the second dielectric layers 110 is high, so that the exposed dielectric fill layers 114 are etched at a faster rate than the second dielectric layers 110, such that there is little or no erosion of the second dielectric layers 110 during removal of the exposed dielectric fill layers 114 to form the via openings. As a result, self-alignment with the conductive lines 112 underlying the via openings, such as via opening 123, is maintained. The etching of the exposed dielectric fill layers 114 is performed using, for example, a selective plasma RIE process.

Figure 6A:
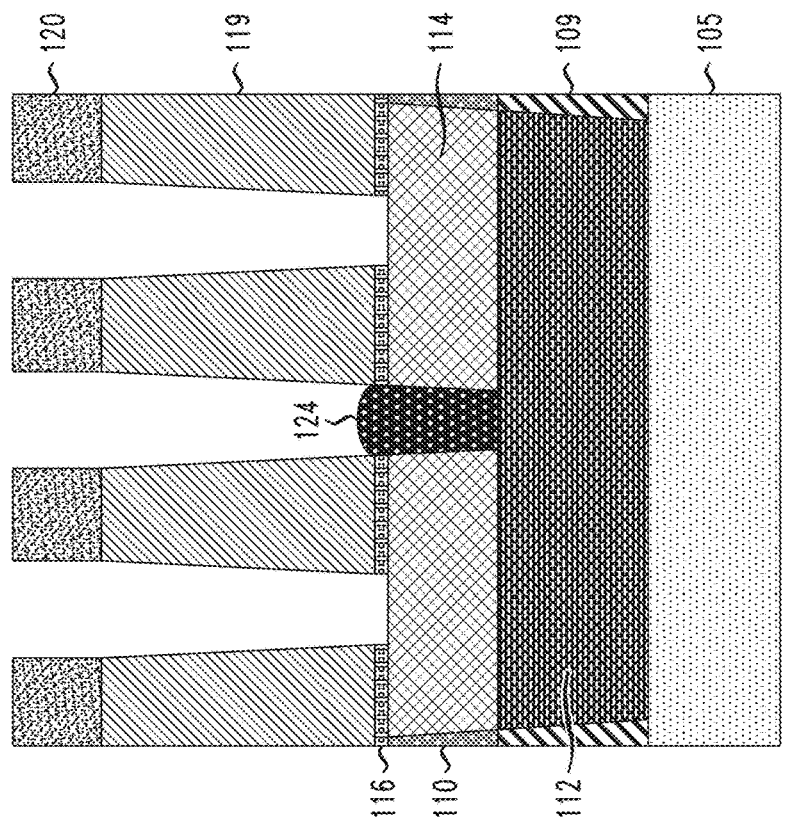
FIG. 6A is a cross-sectional view taken along a first direction illustrating fabrication of a semiconductor device, and showing mask layer removal and via formation, according to an exemplary embodiment of the present invention.
Figure 6B:
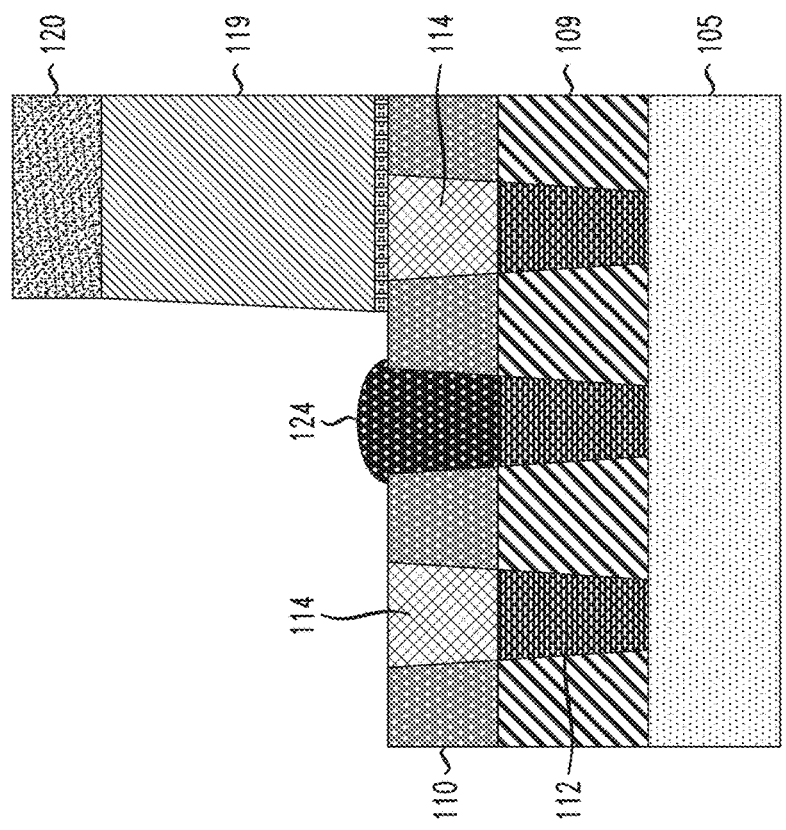
FIG. 6B is a cross-sectional view taken along a second direction perpendicular to the first direction illustrating fabrication of a semiconductor device, and showing mask layer removal and via formation, according to an exemplary embodiment of the present invention.

Referring to FIGS. 6A and 6B, following etching of the dielectric fill layers 114, the mask layer 121 is removed using, for example, an ashing process. Then, vias are formed in the via openings. For example, a via 124 is formed in the via opening 123 to contact the underlying conductive line 112. The via 124 can be formed in a selective metal growth process such as, for example, selective W, Co or Ru growth from a bottom metal line 112. The material of the vias, such as via 124 can include, but is not necessarily limited to, an electrically conductive metal, such as, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides or combinations thereof. According to an embodiment, a top portion of the via 124 extends out of the opening 123 onto top surfaces of adjacent second dielectric layers 110 and to a height above the top surfaces of the adjacent second dielectric layers 110. A top surface of the via 124 may be flat or rounded as shown.

Referring to FIGS. 7A and 7B, after via formation, exposed portions of dielectric fill layers 114 not covered by the ILD layer 119 and hardmask portions 120 are removed to form vacant areas (also referred to as openings), such as vacant areas 133. Similar to the removal of the exposed portions of the dielectric fill layers 114 discussed in connection with FIGS. 5A and 5B, the exposed dielectric fill layers 114 not covered by the ILD layer 119 are selectively removed with respect to the adjacent second dielectric layers 110 to form vacant areas exposing the underlying conductive lines 112, such as vacant areas 133 exposing underlying conductive lines 112. In this step as well as the removal step discussed in connection with FIGS. 5A and 5B, the etch selectivity of the dielectric fill layers 114 with respect to the second dielectric layers 110 is high, so that the exposed dielectric fill layers 114 are etched at a faster rate than the second dielectric layers 110, such that there is little or no erosion of the second dielectric layers 110 during removal of the exposed dielectric fill layers 114 to form the vacant areas. As a result, self-alignment with the conductive lines 112 underlying the vacant areas, such as vacant areas 133, is maintained. The etching of the exposed dielectric fill layers 114 is performed using, for example, a plasma dry etch Referring to FIGS. 8A and 8B, following etching of the dielectric fill layers 114, low-k dielectric material is formed in the vacant areas on the exposed underlying conductive lines 112. For example, low-k dielectric capping layers 129, which will form inter-metal dielectric layers (see FIGS. 9A and 9B), are deposited in vacant areas 133, and contact the underlying conductive lines 112. The low-k dielectric material is deposited using, for example, one or more deposition techniques, such as, but not necessarily limited to, PVD, CVD, ALD, PECVD, RFCVD, MLD, MBD, LSMCD, and/or sputtering followed by an etch-back process. Alternatively, the low-k dielectric material is deposited using spin-on or reflowable dielectric deposition techniques. The material of the low-k dielectric capping layers 129 can include, but is not necessarily limited to, the same or similar materials as those of the dielectric layer 109 or ILD layer 119. According to an embodiment, the low-k dielectric capping layers 129 are also formed out of the vacant areas 133 on top surfaces of adjacent second dielectric layers 110 to a height above the top surfaces of the adjacent second dielectric layers 110. A portion of a low-k dielectric capping layer 129 on a top surface of an adjacent second dielectric layer 110 may contact an adjacent via 124 as shown.

Figure 9C:
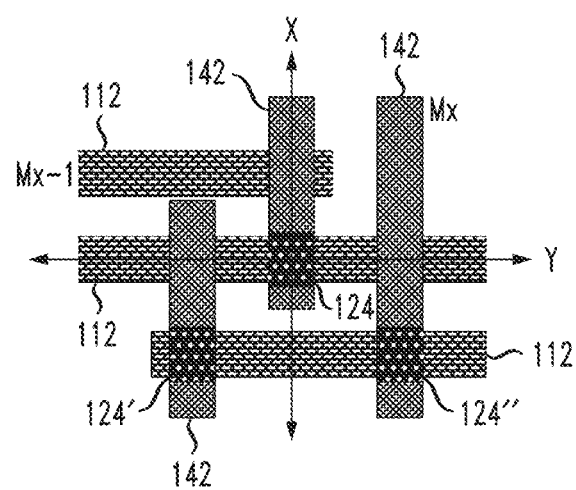
FIG. 9C is a top view illustrating fabrication of a semiconductor device, and showing metal lines of upper and lower level metallization layers, and vias connecting the metal lines, according to an exemplary embodiment of the present invention.

Referring to FIGS. 9A, 9B and 9C, conductive lines 142 and cap layers 144 of an upper level metallization layer are formed. FIGS. 9A and 9B are cross-sectional views taken along X and Y directions, respectively, of the top view in FIG. 9C. The conductive lines 142 are formed on the low-k dielectric capping layers 129 and on the via 124 in the spaces between and/or adjacent portions of the ILD layer 119. Like the conductive lines 112, the conductive lines 142 include an electrically conductive metal, such as, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides or combinations thereof. The conductive lines 142 can also include barrier layers (not shown) and/or liner layers (not shown). The conductive lines 142 and the ILD layer 119 form at least part of an upper metallization level ($M_x$).

The conductive lines 142 are deposited using, for example, one or more deposition techniques, such as, but not necessarily limited to, PVD, CVD, ALD, PECVD, RFCVD, MLD, MBD, LSMCD, and/or sputtering, and may be recessed similarly to recessing of the conductive lines 112 discussed in connection with FIGS. 2A and 2B, such that upper portions of the deposited conductive material is removed so that the top surfaces of the conductive lines 142 are recessed to a height that is below the top surface of the ILD layer 119. Alternatively, deposition of the conductive material to form the conductive lines 142 can be ceased at a predetermined height below the top surface of the ILD layer 119. Cap layers 144 comprising, for example, a material similar to that of the dielectric fill layers 114, are formed on the top surfaces of the conductive lines 142 in the remaining spaces between and/or adjacent portions of the ILD layer 119. The cap layers 144 are formed using for example, one or more deposition techniques, such as, but not necessarily limited to, PVD, CVD, ALD, PECVD, RFCVD, MLD, MBD, LSMCD, and/or sputtering, followed by a planarization process, such as, for example, CMP.

As shown in FIGS. 9A and 9B, in some instances, a conductive line 142 forms an electrical connection with a conductive line 112 through a via, such as via 124 to electrically connect contacts from upper and lower metallization levels $M_x$ and $M_{x-1}$. FIG. 9C shows additional locations where vias 124' and 124" may be formed. In other instances, the low-k dielectric capping layer 129 is between conductive lines 112 and 142 of different metallization levels $M_x$ and $M_{x-1}$, so that the low-k dielectric capping layer 129 functions as an inter-metal dielectric layer between the conductive lines 112 and 142.

Referring to the capacitor circuit symbols in FIGS. 9A and 9B, capacitance between metal lines 112 (or between metal lines 142) in the same metallization level (intra-metal capacitance) and between metal lines in different metallization levels (between metal lines 112 and 142) (inter-metal capacitance) is low because the shortest paths between the metal lines are filled with low-k dielectric material (e.g., layers 109, 119 and 129).

According to embodiments, there is little or no corner erosion of the second dielectric layer 110 in openings where vias 124, 124' or 124" and low-k dielectric capping layers 129 are formed. This is due to the high etch selectivity of the material of dielectric fill layers 114 (e.g., SiN) with respect to the material of the second dielectric layer 110 (e.g., $SiO_2$) when removing the dielectric fill layers 114 in an etching process to form the openings.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A semiconductor device, comprising:
   a first dielectric layer;
   a plurality of lower conductive lines disposed in the first dielectric layer and separated from each other by portions of the first dielectric layer;
   a second dielectric layer disposed on the first dielectric layer;
   at least one via disposed in the second dielectric layer on a first conductive line of the plurality of lower conductive lines;
   at least one dielectric capping layer disposed in the second dielectric layer on a second conductive line of the plurality of lower conductive lines;
   a plurality of upper conductive lines disposed on the at least one via and the at least one dielectric capping layer; and
   at least one dielectric fill layer disposed in the second dielectric layer on a third conductive line of the plurality of lower conductive lines;
   wherein the first dielectric layer and the at least one dielectric capping layer each comprise a low-k dielectric; and wherein the at least one dielectric fill layer comprises a different material from a material of the at least one dielectric capping layer.

2. The semiconductor device according to claim 1, wherein the first dielectric layer has a lower dielectric constant than a dielectric constant of the second dielectric layer.

3. The semiconductor device according to claim 1, wherein the at least one dielectric capping layer has a lower dielectric constant than a dielectric constant of the second dielectric layer.

4. The semiconductor device according to claim 1, wherein the at least one dielectric fill layer comprises a different material from a material of the second dielectric layer.

5. The semiconductor device according to claim 1, wherein the at least one dielectric fill layer has a higher dielectric constant than a dielectric constant of the second dielectric layer.

6. The semiconductor device according to claim 1, wherein the at least one dielectric fill layer comprises a nitride and the second dielectric layer comprises an oxide.

7. The semiconductor device according to claim 1, wherein a top surface of the at least one dielectric fill layer is coplanar with top surfaces of adjacent portions of the second dielectric layer.

8. The semiconductor device according to claim 1, further comprising an inter-layer dielectric layer on top surfaces of the at least one dielectric fill layer and of the second dielectric layer.

9. The semiconductor device according to claim 8, further comprising an etch stop layer between the inter-layer dielectric layer and the top surfaces of the at least one dielectric fill layer and of the second dielectric layer.

10. The semiconductor device according to claim 1, wherein a top portion of the at least one via extends onto a top surface of the second dielectric layer.

11. The semiconductor device according to claim 10, wherein the top portion of the at least one via has a rounded shape.

12. The semiconductor device according to claim 1, wherein a top portion of the at least one dielectric capping layer extends onto a top surface of the second dielectric layer.

13. A semiconductor device, comprising:
a first dielectric layer;
a plurality of lower conductive lines disposed in the first dielectric layer and separated from each other by portions of the first dielectric layer;
a second dielectric layer disposed on the first dielectric layer;
at least one via disposed in the second dielectric layer on a first conductive line of the plurality of lower conductive lines;
at least one dielectric capping layer disposed in the second dielectric layer on a second conductive line of the plurality of lower conductive lines;
a plurality of upper conductive lines disposed on the at least one via and the at least one dielectric capping layer; and
at least one dielectric fill layer disposed in the second dielectric layer on a third conductive line of the plurality of lower conductive lines;
wherein the at least one dielectric fill layer comprises a different material from a material of the at least one dielectric capping layer.

14. The semiconductor device according to claim 13, wherein the at least one dielectric fill layer comprises a different material from a material of the second dielectric layer.

15. The semiconductor device according to claim 13, wherein a top surface of the at least one dielectric fill layer is coplanar with top surfaces of adjacent portions of the second dielectric layer.

16. The semiconductor device according to claim 13, further comprising an inter-layer dielectric layer on top surfaces of the at least one dielectric fill layer and of the second dielectric layer.

17. The semiconductor device according to claim 16, further comprising an etch stop layer between the inter-layer dielectric layer and the top surfaces of the at least one dielectric fill layer and of the second dielectric layer.

18. The semiconductor device according to claim 13, wherein a top portion of the at least one via extends onto a top surface of the second dielectric layer.

19. The semiconductor device according to claim 18, wherein the top portion of the at least one via has a rounded shape.

20. The semiconductor device according to claim 13, wherein a top portion of the at least one dielectric capping layer extends onto a top surface of the second dielectric layer.

* * * * *